US012787167B2

(12) United States Patent
Vasa et al.

(10) Patent No.: US 12,787,167 B2
(45) Date of Patent: Nov. 3, 2026

(54) BGA ANTIPAD DESIGN FOR REDUCED CROSS TALK

(71) Applicant: DELL PRODUCTS L.P., Round Rock, TX (US)

(72) Inventors: Mallikarjun Vasa, Secunderabad (IN); Vijender Kumar, Bangalore (IN); Naga Hara Sathya Sree Tammisetti, Hyderabad (IN); Bhyrav Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 258 days.

(21) Appl. No.: 18/791,750

(22) Filed: Aug. 1, 2024

(65) Prior Publication Data

US 2026/0040446 A1 Feb. 5, 2026

(51) Int. Cl.

*H05K 1/11* (2006.01)
*H05K 1/02* (2006.01)
*H05K 3/40* (2006.01)

(52) U.S. Cl.

CPC ........... *H05K 1/111* (2013.01); *H05K 1/0245* (2013.01); *H05K 1/115* (2013.01); *H05K 3/4007* (2013.01); *H05K 2201/10734* (2013.01)

(58) Field of Classification Search

CPC ..................... H05K 2201/10734; H05K 1/116
See application file for complete search history.

(56) References Cited

U.S. PATENT DOCUMENTS

| | | | | |
|---|---|---|---|---|
| 8,476,537 | B2 * | 7/2013 | Kushta | H05K 1/0251 174/262 |
| 9,603,250 | B2 * | 3/2017 | Hidaka | H05K 1/116 |
| 10,410,683 | B2 * | 9/2019 | Huddar | G06F 1/187 |
| 11,096,270 | B2 * | 8/2021 | Charbonneau | H05K 1/0225 |
| 11,102,878 | B1 * | 8/2021 | Chandra | H05K 1/0245 |
| 12,295,094 | B1 * | 5/2025 | Azeroual | H05K 1/0216 |
| 2008/0101050 | A1 | 5/2008 | Fung | |
| 2009/0188711 | A1 * | 7/2009 | Ahmad | H05K 1/0248 174/262 |
| 2013/0199834 | A1 * | 8/2013 | De Geest | H05K 1/0251 174/266 |
| 2014/0326495 | A1 * | 11/2014 | Paniagua | H05K 3/0005 174/266 |
| 2016/0150645 | A1 * | 5/2016 | Gailus | H05K 3/4038 174/262 |
| 2023/0395968 | A1 | 12/2023 | Kazemi et al. | |
| 2025/0240870 | A1 * | 7/2025 | Ma | H05K 3/0047 |

* cited by examiner

*Primary Examiner* — Timothy J Thompson
*Assistant Examiner* — Amol H Patel
(74) *Attorney, Agent, or Firm* — Larson Newman, LLP

(57) ABSTRACT

A PCB includes a top metal layer having BGA pads, a first internal metal layer having a first breakout trace coupled to a first BGA pad by a first via, a second internal metal layer having a second breakout trace coupled to a second BGA pad by a second via, and a third internal metal having a third breakout trace coupled to a third BGA pad by a third via. In the first internal metal layer, the third via is separated from the first breakout trace by a first antipad having a first dimension. In the second internal metal layer, the third via is separated from the second breakout trace by a second antipad having a second dimension that is greater than the first dimension.

20 Claims, 4 Drawing Sheets

400

410/430

BGA ANTIPAD DESIGN FOR REDUCED CROSS TALK

FIELD OF THE DISCLOSURE

This disclosure generally relates to information handling systems, and more particularly relates to a BGA antipad design for reducing cross talk in a printed circuit board in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board may include a top metal layer having BGA pads, a first internal metal layer having a first breakout trace coupled to a first BGA pad by a first via, a second internal metal layer having a second breakout trace coupled to a second BGA pad by a second via, and a third internal metal having a third breakout trace coupled to a third BGA pad by a third via. In the first internal metal layer, the third via may be separated from the first breakout trace by a first antipad having a first dimension. In the second internal metal layer, the third via may be separated from the second breakout trace by a second antipad having a second dimension that is greater than the first dimension.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
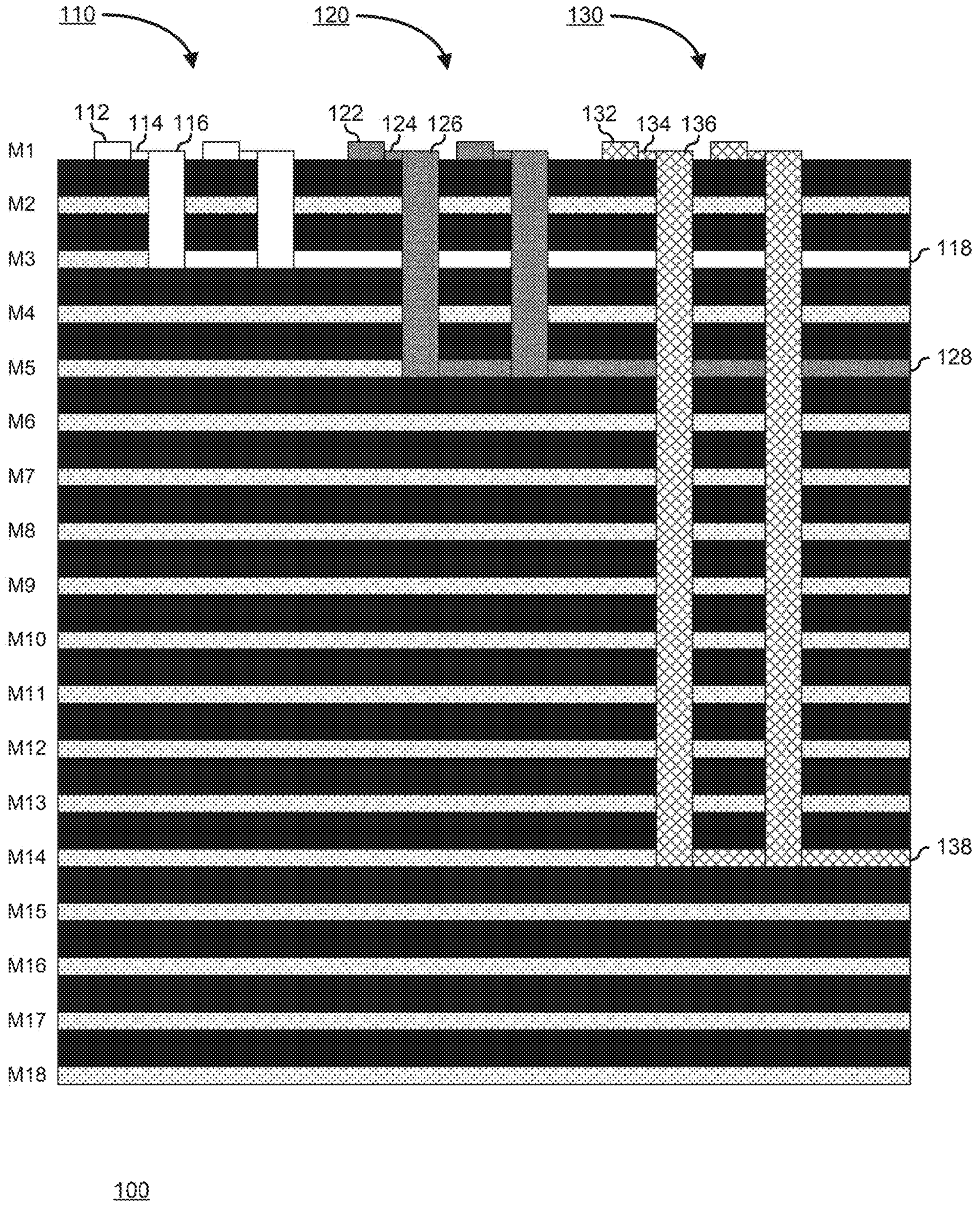
FIG. 1 is a side view of a printed circuit board (PCB) according to an embodiment of the present disclosure.

FIG. 1 illustrates a layer stack-up of a printed circuit board (PCB) 100 including 18 metal layers (M1-M18). PCB 100 further represents a PCB that is manufactured in accordance with various high density interconnect (HDI) methods to pack multiple BGA components in a small footprint. For example, PCB 100 may incorporate buried vias, micro vias, or the like. typically, PCB 100 will be fabricated utilizing various laminate methods and substrate materials, such as photosensitive liquid dielectrics, photosensitive dry film dielectrics, polyimide flexible films, thermally cured dry films, resin-coated copper foil, FR-4 cores and prepregs, spread-glass laser-drillable prepregs, thermoplastics, or the like. Metal layers (M1-M18) represent patterned metalization between the substrate materials, and may include metal layers composed of a base metal such as copper, iron, nickel, or tin, a precious metal such as gold or silver, a heavy metal such as lead and zinc, or a critical raw material (CRM) such as tantalum. Metal layers (M1-M18) may include metal layers that are dedicated to the provision of signal traces for PCB 100, such as layers 3, 5, and 14 (M3, M5, and M14), and one or more additional metal layer for signal traces, as needed or desired. Metal layers (M1-M18) may further include metal layers that are dedicated to the provision of power and ground planes for PCB 100, as needed or desired.

More particularly, PCB 100 represents a portion of the PCB that illustrates a breakout region for a device packaged on a ball grid array (BGA) package. Devices that are packaged on BGA packages generally have a large number of electrical connections (balls connections) that are connected to the PCB within the relatively small footprint of the BGA package. That is, the “density” of connections in the footprint area of the BGA package is very high. In particular, it is typical for the number of metal layers in a PCB to be more closely determined by the routing of the connections to BGA packages, than by any other type of component routing within the PCB. Thus the BGA breakout region has unique challenges in terms of signal routing, signal integrity, and the overall performance of the system embodied on the PCB.

PCB 100 is illustrated as including the BGA breakouts 110, 120, and 130 of three different differential signal pairs. For a first signal of the first differential pair, BGA breakout 110 provides signal routing from a BGA pad 112 through a short signal trace 114 and a signal via 116 to a breakout signal trace 118. The second signal of the first differential pair includes a second BGA pad, a second signal trace, a second signal via, and a second breakout trace, that are all unlabeled to simplify the illustration. For a first signal of the second differential pair, BGA breakout 120 provides signal routing from a BGA pad 122 through a short signal trace 124 and a signal via 126 to a breakout signal trace 128. Again, the second signal of the second differential pair includes a second BGA pad, a second signal trace, a second signal via, and a second breakout trace, that are likewise unlabeled. Finally, for a first signal of the third differential pair, BGA breakout 130 provides signal routing from a BGA pad 132 through a short signal trace 134 and a signal via 136 to a breakout signal trace 138, and again, the second signal of the third differential pair includes a second BGA pad, a second signal trace, a second signal via, and a second breakout trace, that are all unlabeled. BGA breakout 110 provides breakout trace 118 on a third metal layer (M3) of PCB 100, BGA breakout 120 provides breakout trace 128 on a fifth metal layer (M5), and BGA breakout 130 provides breakout trace 138 on a fourteenth metal layer (M14). As such, BGA breakout 110 may be referred to as "layer 3 breakout 110," BGA breakout 120 may be referred to as "layer 5 breakout 120," and BGA breakout 130 may be referred to as "layer 14 breakout 130,"

Figure 2:
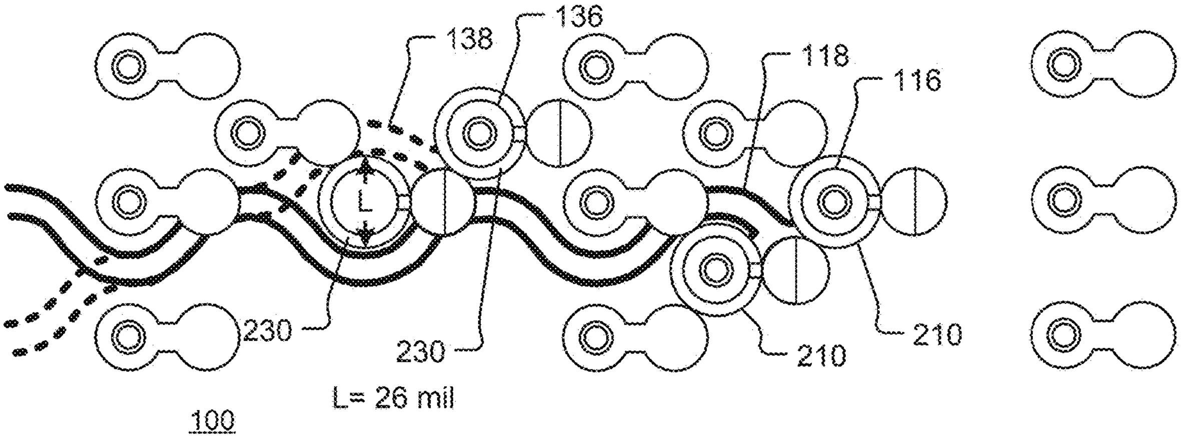
FIG. 2 Prior Art
FIG. 2 is a top view of a PCB as may be known in the art.

FIG. 2 illustrates a top view of a portion of PCB 100, with emphasis on the M3 metal layer and the M14 metal layer, in accordance with the prior art. Vias 116 and breakout traces 118 on the M3 metal layer are illustrated in the foreground, and vias 136 and breakout traces 138 on the M14 metal layer are illustrated in the background. It is well known in the art to provide via antipads surrounding vias that pass through a particular metal layer, but that are not otherwise connected to traces on that metal layer. As such, via antipads represent regions within a particular metal layer that surround the vias that pass through that metal layer, and that are devoid of the metallization on that particular metal layer. Via antipads thus provide an insulating region between the via and the traces within the particular metal layer. FIG. 2 further illustrates via antipads 210 surrounding vias 116 and via antipads 230 surrounding vias 136 on the M3 metal layer. Via antipads 210 and 230 are illustrated as having a 26 mil diameter.

Figure 3:
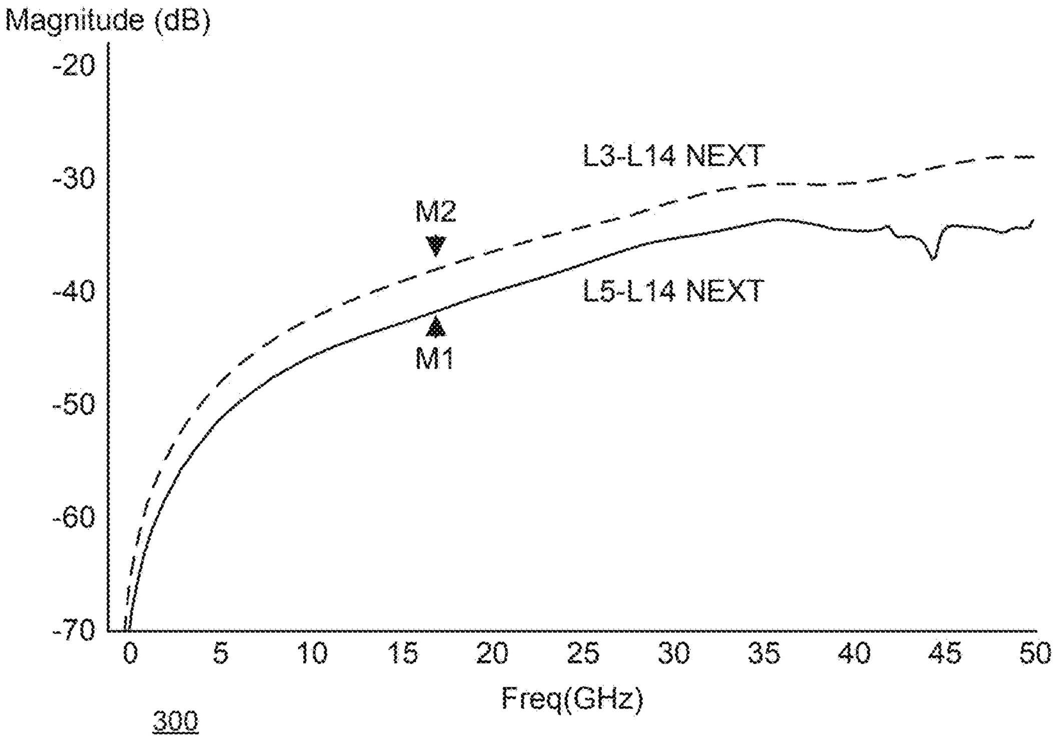
FIG. 3 Prior Art
FIG. 3 is an experimental trace of the PCB of FIG. 2.

It had been thought by the inventors of the current disclosure that crosstalk inducing coupling between layer 5 breakout 120 and layer 14 breakout 130 would be greater than the crosstalk inducing coupling between layer 3 breakout 110 and the layer 14 breakout. This thought had derived from the fact that signal vias 126 are longer than signal vias 116, and that therefore the greater length of signal vias 126 would couple more strongly with signal vias 136 along the length of the respective signal vias. However, experimental results, shown in FIG. 3, show that the layer 3 (M3) to layer 14 (M14) near-end crosstalk (NEXT) is 4-6 dB greater than the layer 5 (M5) to layer 14 (M14) NEXT across a wide frequency band. Rather, the inventors of the current disclosure have understood that fringe fields between the layer 3 (M3) breakout to the BGA pads is the dominant effect, and that the distance between layer 3 (M3) and the top metal layer (M1) is so small that the fringe fields are coupled to the other via pads. It has been further understood that the size and placement of the antipads may affect the fringe fields between the metal layers and the coupled vias.

Figure 4:
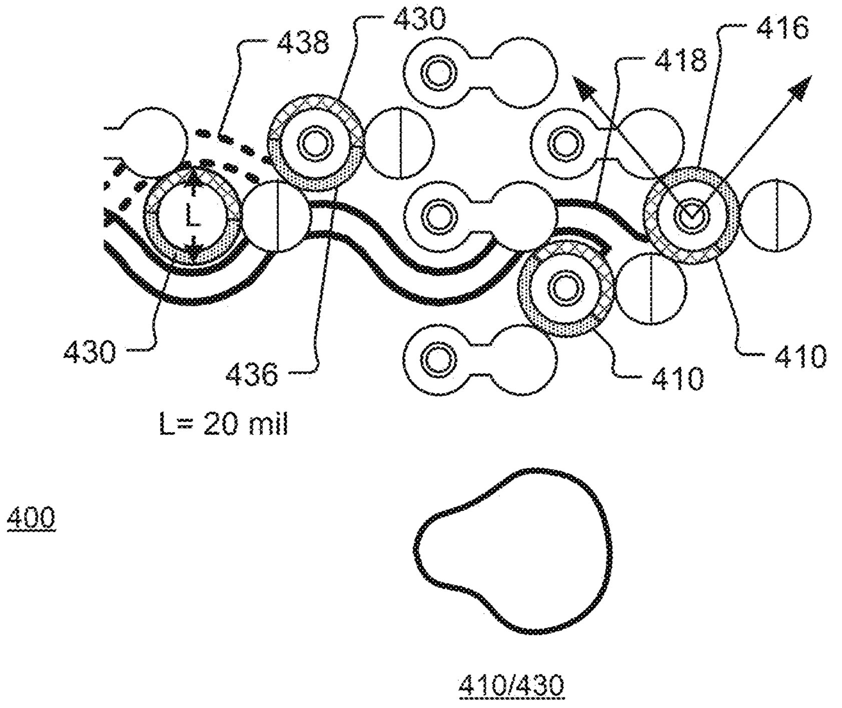
FIG. 4 is a top view of a PCB according to an embodiment of the current disclosure.
Figure 5:
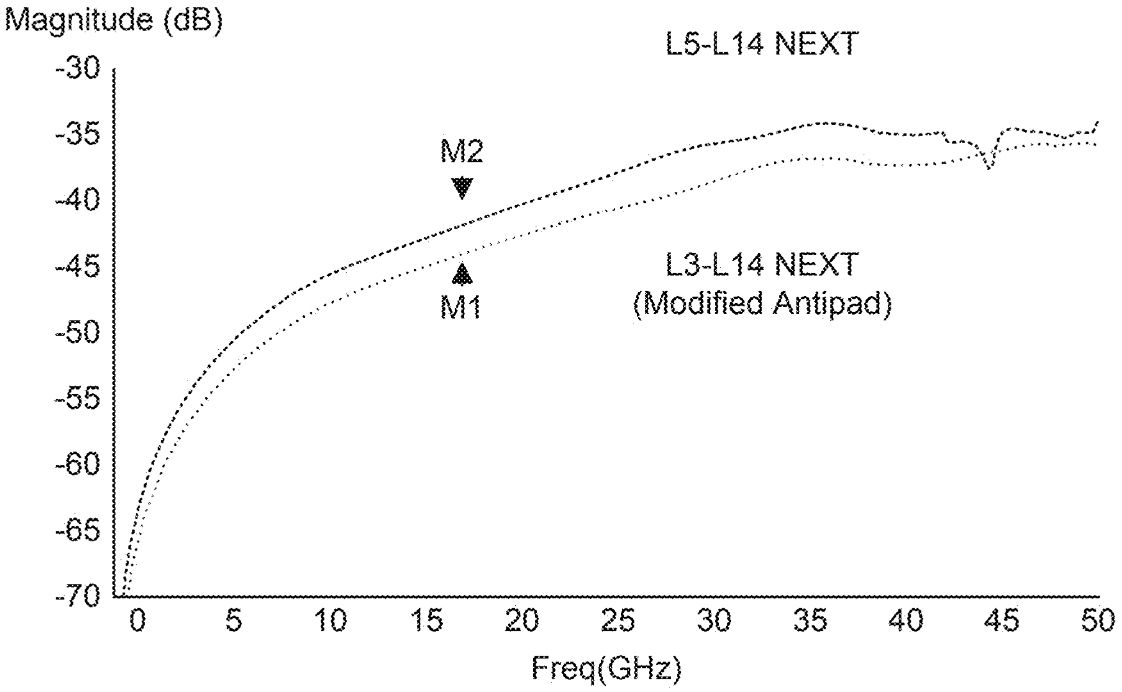
FIG. 5 is an experimental trace of the PCB of FIG. 4.

FIG. 4 illustrates a top view of a portion of PCB 400, with emphasis on the M3 metal layer and the M14 metal layer. PCB 400 includes signal vias 416 similar to signal vias 116, breakout traces 418 similar to breakout traces 118, signal vias 436 similar to signal vias 136, and breakout traces 438 similar to breakout traces 138. In particular, signal vias 416 and breakout traces 418 represent M3 breakout structures and signal vias 436 and breakout traces 438 represent M14 breakout structures. Vias 416 and breakout traces 418 on the M3 metal layer are illustrated in the foreground, and vias 436 and breakout traces 438 on the M14 metal layer are illustrated in the background. PCB 400 further includes via antipads 410 surrounding vias 416 and via antipads 430 surrounding vias 436 on the M3 metal layer. Via antipads 410 and 430 are illustrated as having a 20 mil diameter. It has been understood that the fringe fields occur between the vias and the signal traces. Thus antipads 410 and 430 can be formed in an elliptical shape as shown in FIG. 4, with the narrow end closest to the signal traces, as needed or desired. Experimental results utilizing various antipad configurations are shown in FIG. 5. In particular, the layer 3 (M3) to layer 14 (M14) near-end crosstalk (NEXT) is shown to be 4-6 dB less than the layer 5 (M5) to layer 14 (M14) NEXT across a wide frequency band.

Figure 6:
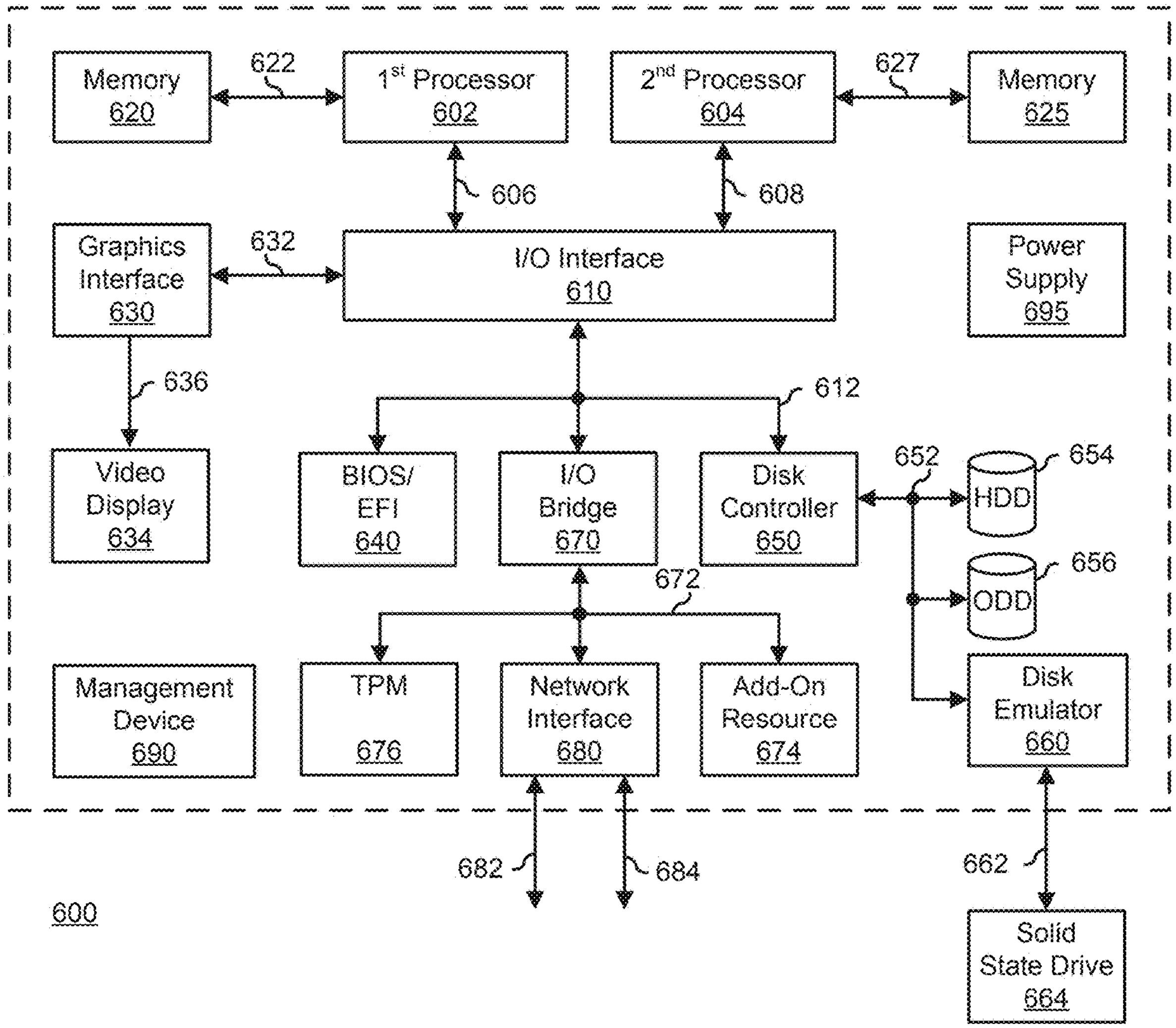
FIG. 6 is a block diagram illustrating a generalized information handling system according to another embodiment of the present disclosure.

FIG. 6 illustrates a generalized embodiment of an information handling system 600 similar to information handling system 600. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below, and operates to perform one or more of the methods described below. Information handling system 600 includes a processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system.

The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632, and provides a video display output 636 to a video display 634. In a particular embodiment, information handling system 600 includes separate memories that are dedicated to each of processors 602 and 604 via separate memory interfaces. An example of memories 620 and 630 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612, or can be a different type of interface. As such, I/O bridge 670 extends the capacity of I/O channel 612 where peripheral interface 672 and the I/O channel are of the same type, and the I/O bridge translates information from a format suitable to the I/O channel to a format suitable to the peripheral channel 672 where they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600. Management device 690 can operate off of a separate power plane from the components of the host environment so that the management device receives power to manage information handling system 600 where the information handling system is otherwise shut down. An example of management device 690 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (IDRAC), an Embedded Controller (EC), or the like. Management device 690 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board (PCB), comprising:

a top metal layer including a plurality of ball grid array (BGA) pads to couple to a BGA device;

a first internal metal layer below the top metal layer, the first internal metal layer including a first breakout trace coupled to a first one of the BGA pads by a first via;

a second internal metal layer below the first internal metal layer, the second internal metal layer including a second breakout trace coupled to a second one of the BGA pads by a second via; and a third internal metal layer below the second internal metal layer, the third internal metal layer including a third breakout trace coupled to a third one of the BGA pads by a third via;

wherein:

in the first internal metal layer, the third via is separated from the first breakout trace by a first antipad having a first dimension; and in the second internal metal layer, the third via is separated from the second breakout trace by a second antipad having a second dimension that is greater than the first dimension.

2. The PCB of claim 1, wherein, in the first internal metal layer, the second via is separated from the first breakout trace by a third antipad having the first dimension.

3. The PCB of claim 1, wherein the third breakout trace exhibits a first near end crosstalk (NEXT) with the first breakout trace.

4. The PCB of claim 3, wherein the third breakout trace exhibits a second NEXT with the second breakout trace.

5. The PCB of claim 4, wherein the first NEXT is less than the second NEXT.

6. The PCB of claim 1, wherein the first antipad is a circular antipad.

7. The PCB of claim 1, wherein the first antipad is an elliptical antipad.

8. The PCB of claim 1, wherein the first internal metal layer further includes a fourth breakout trace coupled to a fourth one of the BGA pads by a fourth via.

9. The PCB of claim 8, wherein the first breakout trace and the fourth breakout trace provide a differential signal pair.

10. The PCB of claim 1, wherein the top metal layer and the first, second, and third internal metal layers are formed of at least one of copper, iron, nickel, tin, gold, silver, lead, zinc, and tantalum.

11. A method, comprising:

providing, in a printed circuit board (PCB), a top metal layer including a plurality of ball grid array (BGA) pads to couple to a BGA device;

providing, in the PCB, a first internal metal layer below the top metal layer, the first internal metal layer including a first breakout trace coupled to a first one of the BGA pads by a first via;

providing, in the PCB, a second internal metal layer below the first internal metal layer, the second internal metal layer including a second breakout trace coupled to a second one of the BGA pads by a second via; and providing, in the PCB, a third internal metal layer below the second internal metal layer, the third internal metal layer including a third breakout trace coupled to a third one of the BGA pads by a third via;

wherein:

in the first internal metal layer, the third via is separated from the first breakout trace by a first antipad having a first dimension; and in the second internal metal layer, the third via is separated from the second breakout trace by a second antipad having a second dimension that is greater than the first dimension.

12. The method of claim 11, wherein, in the first internal metal layer, the second via is separated from the first breakout trace by a third antipad having the first dimension.

13. The method of claim 11, wherein the third breakout trace exhibits a first near end crosstalk (NEXT) with the first breakout trace.

14. The method of claim 13, wherein the third breakout trace exhibits a second NEXT with the second breakout trace.

15. The method of claim 14, wherein the first NEXT is less than the second NEXT.

16. The method of claim 11, wherein the first antipad is a circular antipad.

17. The method of claim 11, wherein the first antipad is an elliptical antipad.

18. The method of claim 11, wherein the first internal metal layer further includes a fourth breakout trace coupled to a fourth one of the BGA pads by a fourth via.

19. The method of claim 18, wherein the first breakout trace and the fourth breakout trace provide a differential signal pair.

20. An information handling system, comprising:

a ball grid array (BGA) device; and a printed circuit board including:

a top metal layer including a plurality of BGA pads coupled to the BGA device;

a first internal metal layer below the top metal layer, the first internal metal layer including a first breakout trace coupled to a first one of the BGA pads by a first via;

a second internal metal layer below the first internal metal layer, the second internal metal layer including a second breakout trace coupled to a second one of the BGA pads by a second via; and a third internal metal layer below the second internal metal layer, the third internal metal layer including a third breakout trace coupled to a third one of the BGA pads by a third via;

wherein:

in the first internal metal layer, the third via is separated from the first breakout trace by a first antipad having a first dimension; and in the second internal metal layer, the third via is separated from the second breakout trace by a second antipad having a second dimension that is greater than the first dimension.

* * * * *